United States Patent [19]
Gardner et al.

[11] Patent Number: 6,051,459
[45] Date of Patent: *Apr. 18, 2000

[54] METHOD OF MAKING N-CHANNEL AND P-CHANNEL IGFETS USING SELECTIVE DOPING AND ACTIVATION FOR THE N-CHANNEL GATE

[75] Inventors: Mark I. Gardner, Cedar Creek; Daniel Kadosh, Austin; Frederick N. Hause, Austin; Derick J. Wristers, Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/803,730

[22] Filed: Feb. 21, 1997

[51] Int. Cl.[7] .................................................. H01L 21/8238
[52] U.S. Cl. ............................................. 438/231; 438/229
[58] Field of Search .................................... 438/231, 232, 438/233, 224, 227, 228, 229, 230, 585, 592

[56] References Cited

U.S. PATENT DOCUMENTS

| | | | |
|---|---|---|---|
| 4,555,842 | 12/1985 | Levinstein et al. | 148/DIG. 82 |
| 4,931,407 | 6/1990 | Maeda et al. | 438/234 |
| 5,021,356 | 6/1991 | Henderson et al. | 438/227 |
| 5,424,229 | 6/1995 | Oyamatsu | 437/35 |
| 5,468,666 | 11/1995 | Chapman | 438/231 |
| 5,480,830 | 1/1996 | Liao et al. | 438/585 |
| 5,744,372 | 4/1998 | Bulucea | 438/231 |
| 5,780,330 | 7/1998 | Choi | 438/232 |
| 5,817,536 | 10/1998 | Nayak et al. | 438/530 |

OTHER PUBLICATIONS

"Silicon Processing for the VLSI ERA—vol. 3: The Submicron MOSFET", Published by Lattice Press, Sunset Beach, California, 1995, pp. 311–313.

M.T. Takagi et al., "A Novel 0.15 μm CMOS Technology using W/WNx/Polysilicon Gate Electrode and Ti Silicided Source/Drain Diffusions", International Electron Devices Meeting Technical Digest, Dec. 8–11, 1996, pp. 455–458.

*Primary Examiner*—Michael Trinh
*Attorney, Agent, or Firm*—Skjerven Morrill MacPherson Franklin & Friel, L.L.P.; William W. Holloway

[57] ABSTRACT

A method of making N-channel and P-channel IGFETs is disclosed. The method includes providing a semiconductor substrate with N-type and P-type active regions, forming a gate material over the N-type and P-type active regions, forming a first masking layer over the gate material, wherein the first masking layer includes an opening above a first portion of the gate material over the P-type active region, and the first masking layer covers a second portion of the gate material over the N-type active region, introducing an N-type dopant into the first portion of the gate material without introducing the N-type dopant into the second portion of the gate material, applying a thermal cycle to drive-in and activate the N-type dopant in the first portion of the gate material before introducing any doping into the second portion of the gate material, before introducing any source/drain doping into the N-type active region, and before introducing any source/drain doping into the P-type active region, forming a second masking layer over the gate material, wherein the second masking layer covers portions of the first and second portions of the gate material, applying an etch to form first and second gates from unetched portions of the first and second portions of the gate material, respectively, and forming an N-type source and drain in the P-type active region and forming a P-type source and drain in the N-type active region. Advantageously, a dopant in the gate for the N-channel IGFET can be driven-in and activated at a relatively high temperature without subjecting any source/drain doping to this temperature.

13 Claims, 3 Drawing Sheets

METHOD OF MAKING N-CHANNEL AND P-CHANNEL IGFETS USING SELECTIVE DOPING AND ACTIVATION FOR THE N-CHANNEL GATE

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. Thereafter, the gate provides an implant mask during the formation of source and drain regions by ion implantation, and the implanted dopants are driven-in and activated using a high-temperature anneal that would otherwise melt the aluminum.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a conductive channel with zero gate voltage, and therefore are normally on. With N-channel depletion-mode devices a negative gate voltage is required to turn the devices off, and with P-channel depletion-mode devices a positive gate voltage is required to turn the devices off.

If the source and body of an IGFET are tied to ground, the threshold voltage can be calculated as follows:

$$V_T = \phi_{ms} - 2\phi_f - Q_{tot}/C_{ox} - Q_{BO}/C_{ox} - \Delta V_T \quad (1)$$

where $\phi_{ms}$ is the work-function difference between the gate material and the bulk silicon in the channel, $\phi_f$ is the equilibrium electrostatic potential in a semiconductor, $Q_{tot}$ is the total positive oxide charge per unit area at the interface between the oxide and the bulk silicon, $C_{ox}$ is the gate oxide capacitance per unit area, $Q_{BO}$ is the charge stored per unit area in the depletion region, and $\Delta V_T$ is a threshold lowering term associated with short-channel effects. Expressions have been established for these various quantities in terms of doping concentrations, physical constants, device structure dimensions, and temperature. For example, the work-function difference $\phi_{ms}$ varies as a function of the doping concentration in a polysilicon gate. Therefore, the threshold voltage depends on the doping concentration in the polysilicon gate.

In the event a polysilicon gate is doped solely by the implant steps that provide source/drain doping, in some instances the doping concentration in the polysilicon gate may not be sufficient to provide the desired threshold voltage. Techniques for increasing the doping concentration in a polysilicon gate independently of source/drain doping are known in the art. For instance, the polysilicon layer that is subsequently etched to form the gate can be doped in situ as deposition occurs. In situ doping involves adding dopant gases such as diborane and phosphine to the chemical vapor deposition gases. Although combining doping and deposition in one step may appear simple, the control of film thickness, dopant uniformity, and deposition rate is greatly complicated by the addition of the dopant gases. Moreover, physical properties of the film such as grain size and grain orientation are affected. Alternatively, the polysilicon layer can be doped by solid phase diffusion. An advantage of this approach is its ability to introduce very high concentrations of the dopant in the polysilicon layer, however, a very high temperature is required and the potential exists for increasing the surface roughness. Furthermore, maxmally doped polysilicon films are typically more important for other applications such as high value load resistors used in static memory, and doping studies. As another approach, the polysilicon layer can be doped by ion implantation. The implant energy is usually selected so that the peak concentration of the dopant is located near the center of the polysilicon layer.

The dopant implanted into the gate is subsequently driven-in and activated using high-temperature processing. A high concentration of the dopant needs to be driven to the gate oxide interface in order to avoid increasing the effective thickness of the gate oxide due to polysilicon depletion near the gate oxide interface. In some instances, the temperature needed to drive-in and activate the dopant in the gate is substantially greater than the temperature needed to drive-in and active the source/drain regions. If the same thermal cycle is used, and the dopant in the gate is adequately driven-in, then the source/drain regions may diffuse further into the substrate than is desired. As one solution, U.S. Pat. No. 5,424,229 discloses doping a polysilicon film by annealing in a POCl$_3$ atmosphere at about 900° C., etching the polysilicon film to form a gate, implanting source/drain regions into the substrate, and then annealing at about 850° C. In this manner, the source/drain regions need not be exposed to the high-temperature processing used during gate formation.

Complementary metal-oxide semiconductor (CMOS) circuits include N-channel (NMOS) devices and P-channel (PMOS) devices. Since boron, a common P-type dopant, tends to diffuse far more rapidly during high-temperature processing than common N-type dopants such as arsenic or phosphorus, it is often desirable to use different anneal temperatures at different stages of the fabrication process.

For instance, a problem encountered in P-channel devices with polysilicon gates containing a high concentration of boron is that when a thin gate oxide is used, poor $V_T$ control may arise due to unwanted boron penetration into the gate oxide, or further, into the underlying channel region. It is reported that boron will penetrate gate oxides that are less than 125 angstroms thick during a 900° C. 30-minute post-implant anneal in nitrogen. It has also been found that the presence of fluorine in the gate oxide worsens the boron penetration problem. Such fluorine can be introduced into the gate oxide if boron difluoride ($BF_2$) is the implant species. Unfortunately, in some instances, the boron penetration may disruption the threshold voltage.

Accordingly, a need exists for an improved method of making N-channel and P-channel devices that provides adequately doped gates while reducing excessive dopant diffusion.

SUMMARY OF THE INVENTION

An object of the present invention is provide an improved method of making N-channel and P-channel IGFETs. This is accomplished by selectively doping and activating a portion of the gate material prior to introducing source/drain doping into the active regions.

In accordance with one aspect of the invention, a method of making N-channel and P-channel IGFETs includes providing a semiconductor substrate with N-type and P-type active regions, forming a gate material over the N-type and P-type active regions, forming a first masking layer over the gate material, wherein the first masking layer includes an opening above a first portion of the gate material over the P-type active region, and the first masking layer covers a second portion of the gate material over the N-type active region, introducing an N-type dopant into the first portion of the gate material without introducing the N-type dopant into the second portion of the gate material, applying a thermal cycle to drive-in and activate the N-type dopant in the first portion of the gate material before introducing any doping into the second portion of the gate material, before introducing any source/drain doping into the N-type active region, and before introducing any source/drain doping into the P-type active region, forming a second masking layer over the gate material, wherein the second masking layer covers portions of the first and second portions of the gate material, applying an etch to form first and second gates from unetched portions of the first and second portions of the gate material, respectively, and forming an N-type source and drain in the P-type active region and forming a P-type source and drain in the N-type active region.

Preferably, the thermal cycle is a rapid thermal anneal at about 1100° C. for 10 to 50 seconds, the thermal cycle is applied before applying the etch, a P-type dopant is initially introduced into the second portion of the gate material after the thermal cycle but before applying the etch, and the sources and drains are driven-in and activated without reaching the temperature used during the thermal cycle. It is also preferred that the gate material is polysilicon and the masking layers are photoresist.

Advantageously, a dopant in the gate for the N-channel device can be driven-in and activated using a thermal cycle at a relatively high temperature before introducing any doping into the gate for the P-channel device and before introducing any source/drain doping for the N-channel or P-channel devices. As a result, the dopants in the gate for the P-channel device and in the source/drain regions need not be subjected to this relatively high temperature, thereby reducing excessive diffusion of these dopants.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
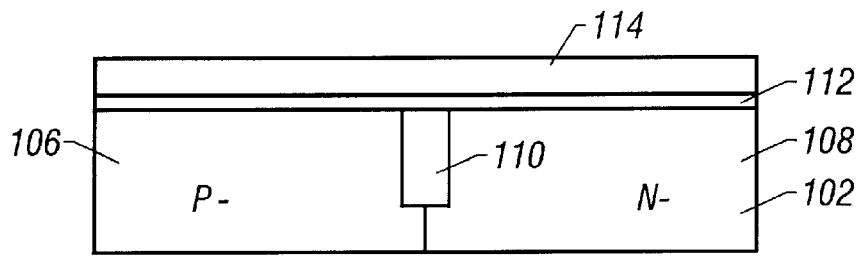
FIGS. 1A–1L show cross-sectional views of successive process steps for making N-channel and P-channel devices using selective doping and activation for the gate of the N-channel device in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture is provided. Substrate 102 includes a P− type epitaxial surface layer on a P+ base layer (not shown). Substrate 102 also includes P− active region 106 and N− active region 108 in the epitaxial surface layer and adjacent to a planar top surface. Active region 106 is a P-well with a boron background concentration on the order of $1 \times 10^{16}$ atoms/$cm^3$, a <100>orientation and a resistivity of 12 ohm-cm. Active region 108 is an N-well with an arsenic background concentration on the order of $1 \times 10^{16}$ atoms/$cm^3$, a <100>orientation and a resistivity of 12 ohm-cm. Active regions 106 and 108 may be subjected to suitable threshold adjust and/or punchthrough implants, as is conventional. Trench oxide 110, composed of silicon dioxide ($SiO_2$), extends into a trench in substrate 102, and provides dielectric isolation between active regions 106 and 108. A blanket layer of gate oxide 112, composed of silicon dioxide, is formed on the top surface of substrate 102 using tube growth at a temperature of 700 to 1000° C. in an $O_2$ containing ambient. Gate oxide 112 has a thickness in the range of 30 to 100 angstroms. Thereafter, polysilicon layer 114 is deposited by low pressure chemical vapor deposition on the top surface of gate oxide 112. Polysilicon layer 114 is undoped and has a thickness of 2000 angstroms.

Figure 1B:
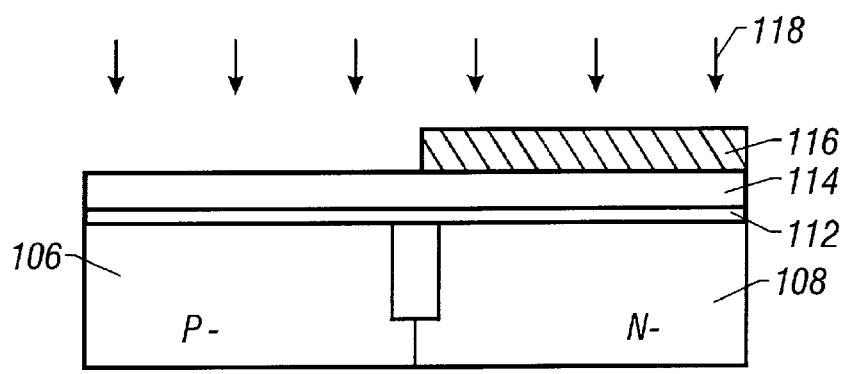

In FIG. 1B, photoresist layer 116 is deposited on polysilicon layer 114. A photolithographic system, such as a step and repeat optical projection system which generates deep ultraviolet light from a mercury-vapor lamp, uses a first reticle to irradiate photoresist layer 116 with a first image pattern. The irradiated portions of photoresist layer 116 are removed, and photoresist layer 116 covers active region 108 but contains an opening above active region 106. Thereafter, the structure is subjected to ion implantation of arsenic, indicated by arrows 118, at a dose in the range of $1 \times 10^{15}$ to $5 \times 10^{15}$ atoms/$cm^2$ and an energy of 10 to 100 kiloelectron-volts, using photoresist layer 116 as an implant mask. As a result, a first portion of polysilicon layer 114 over active region 106 becomes heavily doped with arsenic, and a second portion of polysilicon layer 114 over active region 108 remains undoped. The peak concentration of the arsenic indicated by arrows 118 is implanted into the first portion of polysilicon layer 114, and essentially none of the arsenic indicated by arrows 118 is implanted through the first portion of polysilicon layer 114 into gate oxide 112 or active region 106. If desired, the structure can be subjected to ion implantation of nitrogen (not shown) at a dose of about $5 \times 10^{14}$ to $5 \times 10^{16}$ atoms/$cm^2$ and an energy of 5 to 30 kiloelectron-volts, using photoresist layer 116 as an implant mask. The nitrogen serves to reduce hot carrier injection and off-state leakage current.

Figure 1C:
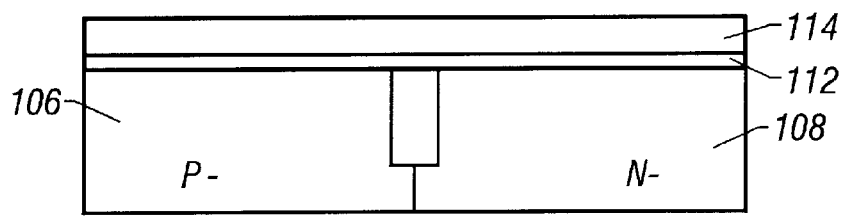

In FIG. 1C, photoresist layer 116 is stripped, and a first rapid thermal anneal on the order of 1100° C. for 10 to 50 seconds is applied to drive-in and activate the arsenic in the first portion of polysilicon layer 114. The first rapid thermal anneal has sufficiently high temperature to assure that a heavy concentration of the arsenic in the first portion of polysilicon layer 114 is driven to the interface with gate oxide 112. Moreover, at this stage, the second portion of polysilicon layer 114 remains undoped, and no source/drain doping has been introduced into active regions 106 or 108.

Figure 1D:
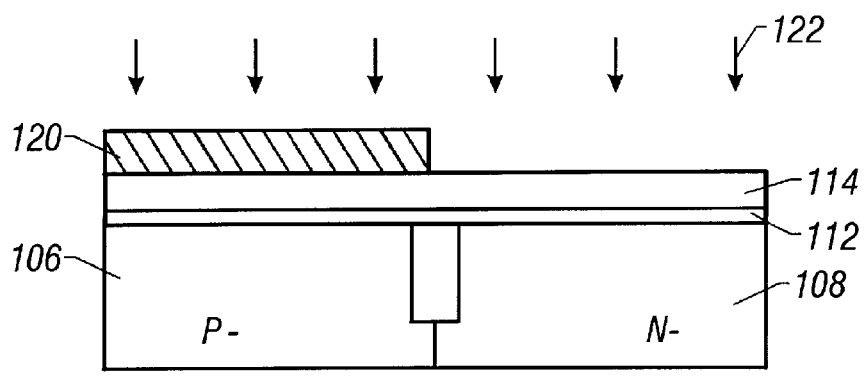

In FIG. 1D, photoresist layer 120 is deposited on polysilicon layer 114. The photolithographic system uses a second reticle to irradiate photoresist layer 120 with a second image pattern. The irradiated portions of photoresist layer 120 are removed, and photoresist layer 120 covers active region 106 but contains an opening above active region 108. Thereafter, the structure is subjected to ion implantation of boron, indicated by arrows 122, at a dose in the range of $1\times10^{15}$ to $5\times10^{15}$ atoms/cm$^2$ and an energy of 10 to 25 kiloelectron-volts, using photoresist layer 120 as an implant mask. As a result, the second portion of polysilicon layer 114 over active region 108 becomes heavily doped with boron, and the first portion of polysilicon layer 114 over active region 106 remains essentially devoid of boron. The peak concentration of the boron indicated by arrows 122 is implanted into the second portion of polysilicon layer 114, and essentially none of the boron indicated by arrows 122 is implanted through the second portion of polysilicon layer 114 into gate oxide 112 or active region 108. Preferably, the structure is also subjected to ion implantation of nitrogen (not shown) at a dose of about $5\times10^{14}$ to $5\times10^{16}$ atoms/cm$^2$ and an energy of 5 to 30 kiloelectron-volts, using photoresist layer 120 as an implant mask. The nitrogen serves to reduce boron penetration during subsequent thermal cycles as well as off-state leakage current.

Figure 1E:
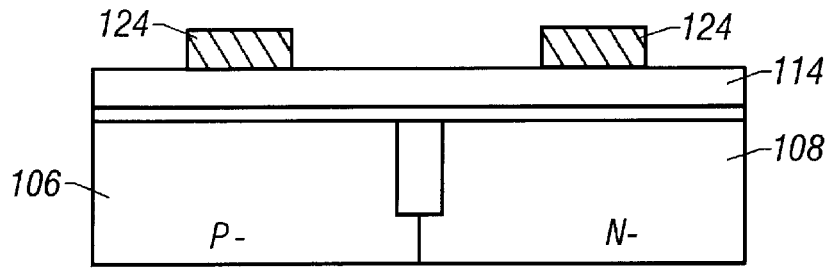

In FIG. 1E, photoresist layer 120 is stripped, and photoresist layer 124 is deposited on polysilicon layer 114. The photolithographic system uses a third reticle to irradiate photoresist layer 124 with a third image pattern. The irradiated portions of photoresist layer 124 are removed, and photoresist layer 124 includes openings above selected portions of active regions 106 and 108.

Figure 1F:
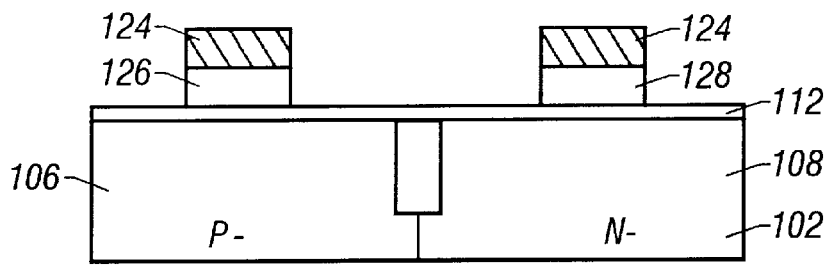

In FIG. 1F, an anisotropic dry etch is applied using photoresist layer 124 as an etch mask. Photoresist layer 124 protects the underlying regions of polysilicon layer 114, and the etch removes the regions of polysilicon layer 114 beneath the openings in photoresist layer 124. The etch is highly selective of polysilicon with respect to silicon dioxide, so only a negligible amount of gate oxide 112 is removed and substrate 102 is unaffected. The etch forms N+ polysilicon gate 126 from the unetched portion of polysilicon layer 114 over active region 106, and P+ polysilicon gate 128 from the unetched portion of polysilicon layer 114 over active region 108. Gates 126 and 128 each have opposing vertical sidewalls separated by a length of 3500 angstroms, and a thickness (or height above the underlying gate oxide 112) of 2000 angstroms.

Figure 1G:
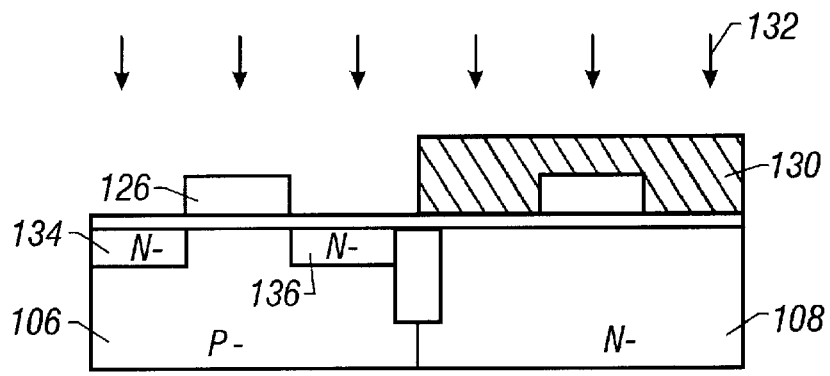

In FIG. 1G, photoresist layer 124 is stripped, and photoresist layer 130 is deposited over the structure. The photolithographic system uses the first reticle to irradiate photoresist layer 130 with the first image pattern, the irradiated portions of photoresist layer 130 are removed, and photoresist layer 130 covers active region 108 but contains an opening above active region 106. Thereafter, lightly doped source and drain regions are implanted into active region 106 by subjecting the structure to ion implantation of phosphorus, indicated by arrows 132, at a dose in the range of $1\times10^{13}$ to $5\times10^{14}$ atoms/cm$^2$ and an energy of 2 to 35 kiloelectron-volts, using gate 126 and photoresist layer 130 as an implant mask. As a result, lightly doped source/drain regions 134 and 136 are implanted into active region 106 outside gate 126 and are self-aligned to the opposing vertical sidewalls of gate 126. Lightly doped source/drain regions 134 and 136 are doped N– with a phosphorus concentration in the range of about $1\times10^{17}$ to $1\times10^{18}$ atoms/cm$^3$, and provide the initial source/drain doping in active region 106.

Figure 1H:
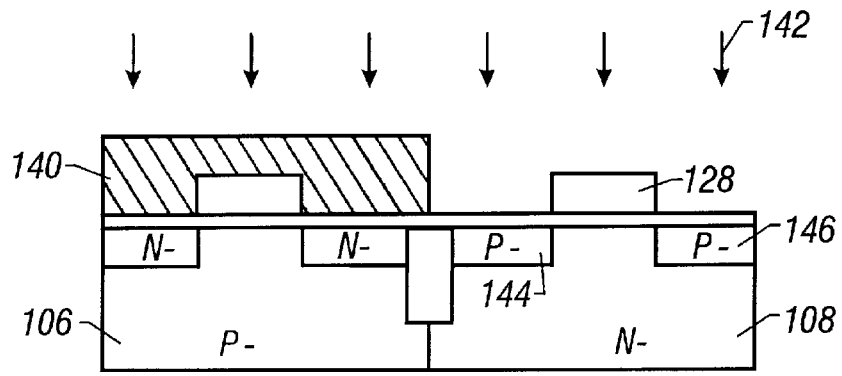

In FIG. 1H, photoresist layer 130 is stripped, and photoresist layer 140 is deposited over the structure. The photolithographic system uses the second reticle to irradiate photoresist layer 140 with the second image pattern, the irradiated portions of photoresist layer 140 are removed, and photoresist layer 140 covers active region 106 but contains an opening above active region 108. Thereafter, lightly doped source and drain regions are implanted into active region 108 by subjecting the structure to ion implantation of boron, indicated by arrows 142, at a dose in the range of $1\times10^{13}$ to $5\times10^{14}$ atoms/cm$^2$ and an energy of 10 to 25 kiloelectron-volts, using gate 128 and photoresist layer 140 as an implant mask. As a result, lightly doped source/drain regions 144 and 146 are implanted into active region 108 outside gate 128 and are self-aligned to the opposing vertical sidewalls of gate 128. Lightly doped source/drain regions 144 and 146 are doped P– with a boron concentration in the range of about $1\times10^{17}$ to $1\times10^{18}$ atoms/cm$^3$, and provide the initial source/drain doping in active region 108.

Figure 1I:
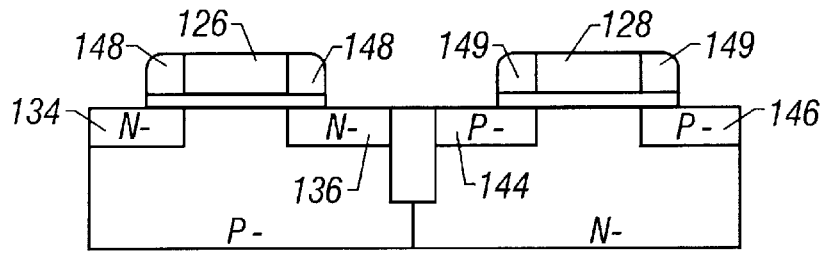

In FIG. 1I photoresist layer 140 is stripped, and an oxide layer with a thickness of 1500 angstroms is conformably deposited over the exposed surfaces by plasma enhanced chemical vapor deposition at a temperature in the range of 300 to 450° C. Thereafter, the structure is subjected to an anisotropic reactive ion etch that forms oxide spacers 148 adjacent to the opposing sidewalls of gate 126 and oxide spacers 149 adjacent to the opposing sidewalls of gate 128. Spacers 148 cover portions of lightly doped source/drain regions 134 and 136, and spacers 149 cover portions of lightly doped source/drain regions 144 and 146.

Figure 1J:
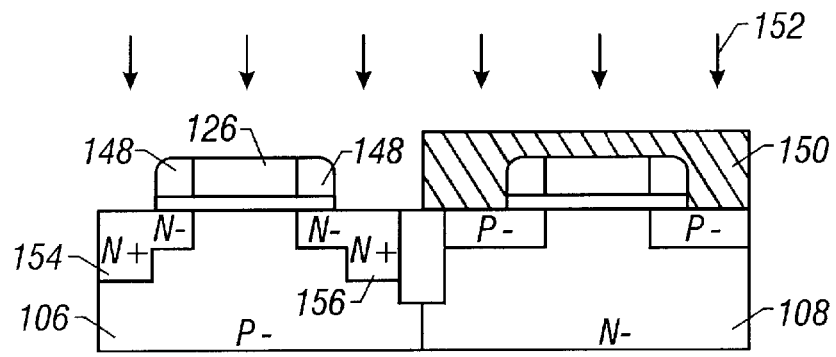
Figure 1K:
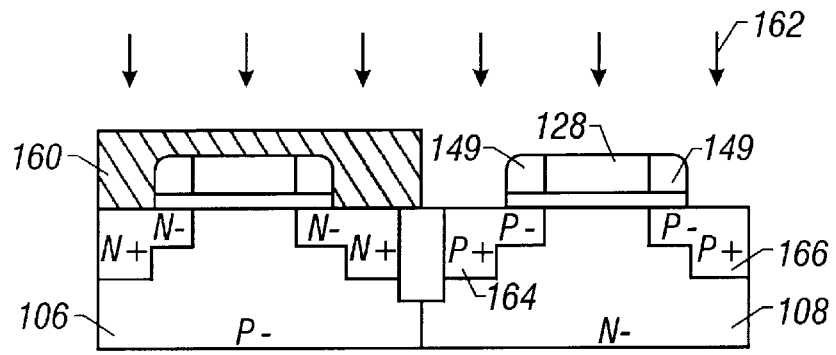

In FIG. 1J, photoresist layer 150 is deposited over the structure. The photolithographic system uses the first reticle to irradiate photoresist layer 150 with the first image pattern, the irradiated portions of photoresist layer 150 are removed, and photoresist layer 150 covers active region 108 but contains an opening above active region 106. Thereafter, heavily doped source and drain regions are implanted into active region 106 by subjecting the structure to ion implantation of arsenic, indicated by arrows 152, at a dose in the range of $1\times10^{15}$ to $5\times10^{15}$ atoms/cm$^2$ and an energy of 10 to 80 kiloelectron-volts, using gate 126 and spacers 148 and photoresist layer 150 as an implant mask. As a result, heavily doped source/drain regions 154 and 156 are implanted in active region 106 and are self-aligned to the outside edges of spacers 148. Heavily doped source/drain region 154 and 156 are doped N+ with an arsenic concentration in the range of about $1\times10^{18}$ to $1\times10^{20}$ atoms/cm$^3$ In FIG. 1K, photoresist layer 150 is stripped, and photoresist layer 160 is deposited over the structure. The photolithographic system uses the second reticle to irradiate photoresist layer 160 with the second image pattern, the irradiated portions of photoresist layer 160 are removed, and photoresist layer 160 covers active region 106 but contains an opening above active region 108. Thereafter, heavily doped source and drain regions are implanted into active region 108 by subjecting the structure to ion implantation of boron, indicated by arrows 162, at a dose in the range of $1\times10^{15}$ to $5\times10^{15}$ atoms/cm$^2$ and an energy of 15 to 30 kiloelectron-volts, using gate 128 and spacers 149 and photoresist layer 160 as an implant mask. As a result, heavily doped source/drain regions 164 and 166 are implanted in active region 108 and are self-aligned to the outside edges of spacers 149. Heavily doped source/drain regions 164 and 166 are doped P+ with a boron concentration in the range of about $1\times10^{18}$ to $1\times10^{20}$ atoms/cm$^3$.

Figure 1L:
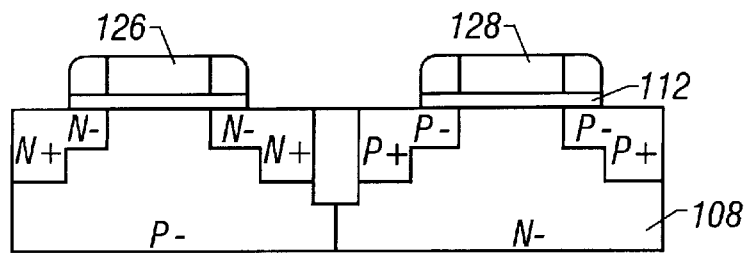

In FIG. 1L, photoresist layer 160 is stripped, and the device is annealed to remove crystalline damage and to drive-in and activate the implanted dopants in gate 128 and in all the source/drain regions by applying a second rapid thermal anneal on the order of 800 to 1050° C. for 10 to 60 seconds. Advantageously, the dopant in gate 126 has already been driven-in and activated during the first rapid thermal anneal, and therefore, the second rapid thermal anneal need not reach 1100° C. In addition, the dopants in gate 128 and the source/drain regions need not be subjected to the 1100° C. temperature of the first rapid thermal anneal, thereby reducing excessive diffusion of these dopants. Since boron is a rapid diffuser, the second rapid thermal anneal drives a heavy concentration of the boron in gate 128 to the interface with gate oxide 112. However, no appreciable amount of the boron in gate 128 is diffused into gate oxide 112 or through gate oxide 112 into active region 108.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, earlier or subsequent high-temperature process steps can be used to supplement the anneal steps to provide the desired anneal, activation, and drive-in functions. These further processing steps are conventional. Likewise the principal processing steps disclosed herein may be combined with other steps apparent to those skilled in the art.

The present invention includes numerous variations to the embodiment described above. For instance, the second portion of the gate material (over the N-type active region) can be undoped when the gate material is etched to form the gates. The thermal cycle that drives-in and activates the dopant in the first portion of the gate material (over the P-type active region) can be applied after etching the gate material to form the gates, as long as source/drain doping has not yet been introduced. Of course, the temperatures listed above are exemplary. Preferably, the thermal cycle is a rapid thermal anneal in the range of 900 to 1100° C. and has a substantially higher temperature than any temperature applied to the dopant in the second portion of the gate material or the source/drain doping.

The nitrogen implants into the gate material are optional, although implanting nitrogen into the first portion of the gate material is considered less important than implanting nitrogen into the second portion of the gate material.

Furthermore, the gate material can be various conductors, and the gate insulator and spacers can be various dielectrics such as silicon dioxide, silicon nitride and silicon oxynitride. The active regions can be isolated using various techniques such as LOCOS oxidation. The N-channel and P-channel devices can be symmetrical or asymmetrical transistors, that is, with or without lightly doped source regions. Suitable N-type dopants include arsenic and phosphorus; suitable P-type dopants include boron $B_{10}$, boron $B_{11}$, and $BF_X$ species such as $BF_2$.

The invention is particularly well-suited for fabricating N-channel MOSFETs, P-channel MOSFETs and other types of IGFETs, particularly for high-performance microprocessors where high circuit density is essential. Although a single pair of N-channel and P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making N-channel and P-channel IGFETS, comprising:

providing a semiconductor substrate with N-type and P-type active regions;

forming a gate insulator on the N-type and P-type active regions;

forming a gate material over the gate insulator;

forming a first masking layer over the gate material, wherein the first masking layer includes an opening above a first portion of the gate material over the P-type active region, and the first masking layer covers a second portion of the gate material over the N-type active region;

introducing an N-type dopant into the first portion of the gate material without introducing the N-type dopant into the second portion of the gate material;

applying a first thermal cycle to activate the N-type dopant in the first portion of the gate material before introducing any doping into the second portion of the gate material, before introducing any source/drain doping into the N-type active region, and before introducing any source/drain doping into the P-type active region;

removing the first masking layer;

forming a second masking layer over the gate material, wherein the second masking layer includes an opening above a second portion of the gate material over the N-type active region, and the second masking layer covers the first portion of the gate material over the P-type active region;

introducing an P-type dopant into the second portion of the gate material without introducing the P-type dopant into the first portion of the gate material forming a third masking layer over the gate material, wherein the third masking layer covers portions of the first and second portions of the gate material;

applying an etch to form first and second gates from unetched portions of the first and second portions of the gate material, respectively;

forming an N-type source and drain in the P-type active region and forming a P-type source and drain in the N-type active region, and applying a second thermal cycle, the second thermal cycle having a lower temperature than the first thermal cycle.

2. The method of claim 1, wherein the lower temperatures of the second thermal cycle prevent excessive diffusion.

3. The method of claim 1, wherein the steps are performed in the sequence set forth.

4. The method of claim 1, including introducing the N-type dopant using ion implantation, and applying the first thermal cycle using a rapid thermal anneal.

5. The method of claim 1, wherein the gate material is polysilicon, and the first and second masking layers are photoresist.

6. A method of making N-channel and P-channel IGFETs, comprising:

provide a semiconductor substrate with N-type and P-type active regions;

forming a gate insulator on the N-type and P-type active regions;

forming a gate material on the gate insulator and over the N-type and P-type active regions;

forming a first masking layer over the gate material, wherein the first masking layer includes an opening above a first portion of the gate material over the P-type active region, and the first masking layer covers a second portion of the gate material over the N-type active region;

implanting an N-type dopant into the first portion of the gate material without implanting the N-type dopant into the second portion of the gate material;

removing the first masking layer;

forming a second masking layer over the material, wherein the second masking layer covers portions of the first and second portions of the gate material;

applying an etch to form first and second gates from unetched portions of the first and second portions of the gate material, respectively;

removing the second masking layer applying a first thermal cycle to activate the N-type dopant in the first gate before introducing any doping into the second gate, before introducing any source/drain doping into the N-type active region, and before introducing any source/drain doping into the P-type active region; then implanting an P-type dopant in the second gate;

forming an N-type source and drain in the P-type active region and forming a P-type source and drain in the N-type active region; and applying a second thermal cycle at temperatures below temperatures of the first thermal cycle.

7. The method of claim 6, wherein the lower temperatures of the second thermal cycle prevent excessive diffusion.

8. The method of claim 6, wherein the gate material is polysilicon.

9. The method of claim 6, wherein the first and second masking layers are photoresist.

10. The method of claim 6, wherein the N-type and P-type active regions are adjacent to opposite sides of a dielectric isolation region in the substrate.

11. The method of claim 6, wherein the thermal cycle is a rapid thermal anneal with a temperature in the range of 900 to 1100° C. and a duration in the range of 10 to 50 seconds.

12. The method of claim 6, wherein the steps are performed in the sequence set forth.

13. A method of making N-channel and P-channel IGFETs, comprising in sequence set fourth:

providing a semiconductor substrate with N-type and P-type active regions;

forming a gate oxide on the N-type and P-type active regions;

forming an undoped polysilicon layer on the gate oxide and over the N-type and P-type active regions;

forming a first photoresist layer over the polysilicon layer, wherein the first photoresist layer includes an opening above a first portion of the polysilicon layer over the P-type active region, and the first photoresist layer covers a second portion of the polysilicon layer over the N-type active region;

implanting an N-type dopant into the first portion of the polysilicon layer, using the first photoresist layer as an implant mask, without implanting the N-type dopant into the second portion of the polysilicon layer;

removing the first photoresist layer;

applying a rapid thermal anneal to drive-in and activate the N-type dopant in the first portion of the polysilicon layer before introducing any doping into the second portion of the polysilicon layer, before introducing any source/drain doping into the N-type active region, and before introducing any source/drain doping into the P-type active region;

forming a second photoresist layer over the polysilicon layer, wherein the second photoresist layer covers the first portion of the polysilicon layer, and the second photoresist layer includes an opening above the second portion of the polysilicon layer;

implanting a P-type dopant into the second portion of the polysilicon layer, using the second photoresist layer as an implant mask, without implanting the P-type dopant into the first portion of the polysilicon layer;

removing the second photoresist layer;

forming a third photoresist layer over the polysilicon layer, wherein the third photoresist layer covers portions of the first and second portions of the polysilicon layer;

applying an anisotropic etch, using the third photoresist layer as an etch mask, to form first and second gates from unetched portions of the first and second portions of the polysilicon layer, respectively;

removing the third photoresist layer; and forming an N-type source and drain in the P-type active region and forming a P-type source and drain in the N-type active region, including driving-in and activating the second gate and the sources and drains without reaching a temperature of the rapid thermal anneal.

* * * * *